United States Patent [19]

Desai et al.

[11] 4,396,702
[45] Aug. 2, 1983

[54] METHOD OF FORMING PATTERN IN POSITIVE RESIST MEDIA

[75] Inventors: Nitin V. Desai, Hightstown; Eugene S. Poliniak, Willingboro, both of N.J.

[73] Assignee: RCA Corporation, New York, N.Y.

[21] Appl. No.: 320,015

[22] Filed: Nov. 10, 1981

[51] Int. Cl.³ .................. B05D 3/02; B05D 3/06; G03C 5/00

[52] U.S. Cl. .................. 430/296; 430/270; 430/276; 430/317; 430/318; 430/323; 430/326; 430/330; 430/327; 427/43.1; 204/159.13; 156/643

[58] Field of Search ............ 430/296, 270, 272, 276, 430/286, 303, 326, 323, 330, 317, 318, 327; 427/43.1; 204/159.13; 156/643

[56] References Cited

U.S. PATENT DOCUMENTS

| | | | |
|---|---|---|---|
| 4,041,190 | 8/1977 | Dubois et al. | 430/296 |
| 4,126,712 | 11/1978 | Poliniak et al. | 430/323 |
| 4,158,617 | 6/1979 | Eldred | 204/159.13 |
| 4,237,208 | 12/1980 | Desai et al. | 430/296 |
| 4,262,083 | 4/1981 | Pampalone et al. | 430/296 |
| 4,289,845 | 9/1981 | Bowden et al. | 430/323 |
| 4,301,231 | 11/1981 | Atarashi et al. | 430/296 |
| 4,357,369 | 11/1982 | Kilichowski et al. | 156/643 |

OTHER PUBLICATIONS

Bowden, M. J., "X. Electron Resist Reviews", *CRL Critical Reviews in Solid State Sciences*, Feb. 1979, pp. 251–262.

*Primary Examiner*—Charles L. Bowers, Jr.
*Attorney, Agent, or Firm*—Birgit E. Morris; R. Hain Swope

[57] ABSTRACT

This invention relates to novel poly(silane sulfone) copolymers having repeating units represented by the formula

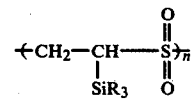

wherein R is alkyl and n is an integer. Positive resist recording media prepared from the subject copolymers demonstrate excellent sensitivity and resolution and are resistant to oxygen plasma etching.

9 Claims, No Drawings

METHOD OF FORMING PATTERN IN POSITIVE RESIST MEDIA

This invention relates to novel poly(silane sulfone) copolymers useful as positive resist recording media in the manufacture of electronic devices including microelectronic circuits.

CROSS REFERENCE TO RELATED APPLICATIONS

This application is related to U.S. Pat. No. 4,357,369 entitled "Method of Plasma Etching a Substrate" by K. B. Kilichowski and T. R. Pampalone, which issued Nov. 2, 1982 and which is incorporated herein by reference.

BACKGROUND OF THE INVENTION

Significant advances in recent years in the reduction in physical size and cost of electronic components have resulted from improvements in techniques for the manufacture of microelectronic circuits, e.g. microlithography. Microlithography, generally, comprises applying a film of a radiation-sensitive polymeric material, i.e. a resist medium, to one surface of a substrate, irradiating certain portions of the film with, e.g. ultraviolet light, an electron beam, X-rays or the like, and developing the film with a solvent to remove solubilized portions thereof. In the instance of a positive resist, irradiation causes the resist medium to become more soluble in the developer solvent. The resist medium remaining on the surface of the substrate is then employed as a protective mask to facilitate the selective etching or other treatment of the exposed portions of the substrate.

Etching of the substrate may be conventionally carried out by chemical treatment or by plasma discharge. Plasma etching, generally, affords finer resolution than chemical etching and is additionally advantageous in that it is free of the pollution and handling problems inherent in the use of chemical etchants. Many resist materials, however, cannot withstand plasma discharge and are eroded along with the substrate resulting in loss of pattern resolution. Therefore, chemical etching is more commonly used in spite of the aboved-named disadvantages.

There is a continuing search for polymeric materials with increased sensitivity to irradiation to achieve higher resolution in answer to the demand for ever-finer circuitry. The positive electron beam recording media provided in accordance with this invention possesses increased sensitivity, good adherence to most substrates and good development latitude. The recording media of this invention further unexpectedly possesses excellent resistance to oxygen plasma etching.

SUMMARY OF THE INVENTION

In accordance with this invention, there are provided novel poly(silane sulfone) copolymers useful as positive electron beam recording media.

DETAILED DESCRIPTION OF THE INVENTION

The novel poly(silane sulfone) copolymers of this invention have repeating units represented by the formula

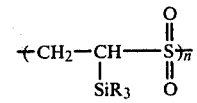

wherein R is an alkyl group and n is an integer. Although the length of the alkyl chain is not critical to the performance of recording media prepared from the subject copolymers, shorter chains are preferred, i.e. where R is lower alkyl, with methyl being especially preferred. As utilized herein, the term "lower alkyl" indicates a straight- or branched-chain alkyl group having one to six carbon atoms.

The novel copolymers of this invention can be prepared in a conventional manner by free radical polymerization of the silane monomer and sulfur dioxide. The free-radical polymerization is carried out in the presence of a conventional polymerization initiator such as, for example, t-butylhydroperoxide. The molecular weight of the copolymer is controlled by the amount of polymerization initiator present with increased amounts giving lower molecular weights.

The molecular weight of the novel copolymers of this invention should be sufficiently high so that, when areas of a resist film formed therefrom are selectively irradiated, there will be a sufficient reduction in the molecular weight of the irradiated portions to create a significant difference in relative solubility between irradiated and non-irradiated film. The molecular weight is further important in terms of solubility of the subject copolymers in the solvents used to cast such films. The requirements for molecular weight will vary to some extent depending on the type of group represented by R in the above formula. However, in general, a molecular weight of from about 50,000 to about 200,000, or above, is satisfactory for the purposes of this invention.

In order to apply the novel copolymers of this invention to a substrate, the copolymer is initially dissolved in a suitable organic solvent. The resulting solution is then coated onto the substrate in a conventional manner, e.g., by casting, spraying, spin-coating and the like. The solution usually contains from about 6 to about 20 percent by weight, preferably from about 10 to about 15 percent by weight, of the copolymer. Suitable solvents should have boiling points below the decomposition point of the copolymer thus permitting removal of the solvent from the coating by heat or by vacuum drying. Removal of the solvent forms a uniform resist film of the copolymer on the substrate. Examples of suitable solvents for the novel copolymers of this invention include 2-methoxyethyl acetate and cyclopentanone with the latter being preferred.

The recording medium films are formed on the substrate in various thicknesses from about 0.1 micron to 5 microns, depending on the intended use of the recording media. It is preferred to bake the film in air or vacuum usually at a temperature above the glass transition temperature of the copolymer, but below its thermal decomposition point. The baking removes traces of solvent and anneals out stresses and strains in the film.

The recording medium resist films of the copolymers of this invention are selectively irradiated with, for example, an electron beam, a modulated electron beam or X-rays, thereby causing degradation of the copolymer in the irradiated areas. It is preferred in accordance with this invention to irradiate films of the subject copolymers with an electron beam or a modulated electron beam. The specific exposure flux will normally depend on the thickness of the resist medium coating. Generally, for exposure of a resist medium film having a thickness of from about 0.1 to about 5 microns, electron beam irradiation from about 0.2 to about 10 microcoulombs/cm$_2$ is utilized.

When utilized as positive working resists, films of the novel copolymers of this invention are cast to a thickness equal to or less than the depth of penetration of the electron beam, thus exposing the substrate upon development. Alternatively, the copolymers of this invention can be utilized as media for recording of surface relief patterns by exposing thicker films to well-defined patterns which, upon development, correspond in relief to the information recorded.

The irradiated film may be developed utilizing a solvent which will dissolve both the irradiated and non-irradiated portions, but will dissolve the irradiated portion more rapidly. Utilizing this method, the thickness of the resist film will be adjusted so that, after development, there will be sufficient film remaining in the non-irradiated areas to protect the underlying substrate during subsequent operations such as etching. Development may also be carried out utilizing a solvent which exclusively dissolves the irradiated portion of the film. This technique tends to give sharper resolution, but generally requires longer and more careful developing than the use of a common solvent.

Suitable solvent/developers for the copolymers of this invention include, for example, alcohols such as 2-methoxyethanol, isopropanol, ethoxyethanol, 2-methylcyclohexanol and the like with 2-methoxyethanol being preferred. These alcohols may be used individually, in combination or in combination with a ketone solvent/developer such as, for example, acetone, ethylacetoacetate, 2-methoxyethylacetate, cyclopentanone, tetrahydrofuran, 2-methylcyclohexanone and the like.

The recording media of this invention may, after removal of the irradiated portion, i.e. after development, provide a pattern on the substrate which is used conventionally as a guide for the formation of circuits and the like. The substrates which may be advantageously so treated include, for example, plastic or plastic laminates, porcelain-coated metals such as steel or steel alloys, metal-coated wafers, ceramic wafers, chrome- or nickel-coated glass and the like on which it is desired to form a microelectronic circuit. Wherein portions of the substrate have been exposed by development, the desired pattern is formed therein by the use of the conventional etchant therefor, e.g. ferric chloride solutuons for steel, hydrofluoric acid solutions for glass and the like.

Exposed portions of the substrate may likewise be etched by oxygen plasma discharge as disclosed in U.S. Pat. No. 4,357,369. Since many resist materials described in the literature are not suitable for oxygen plasma etching due to being eroded thereby, the oxygen plasma resistance is an unexpected advantage of the subject copolymers. The type of etching utilized in a given instance, therefore, will depend on factors such as the substrate involved, the type of pattern to be delineated therein and the like.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE 1

Part A

A total of 20 ml of vinyltrimethylsilane and 50 ml sulfur dioxide were thoroughly mixed in a suitable reaction vessel under a nitrogen atmosphere at $-70°$ in a dry ice-isopropanol bath. To this mixture was added with stirring 0.2 ml of t-butylhydroperoxide and the contents of the vessel allowed to stand overnight at constant temperature. The resulting viscous solution was mixed with 200 ml of chloroform and allowed to warm to ambient temperature. The chloroform solution was added with stirring to 1,000 ml of methanol. The white precipitate which formed was recovered by filtration, washed with methanol and dried overnight at 30° under vacuum. Analysis of the product revealed it to be a 1:1 copolymer having a molecular weight of about 100,000.

Part B

A ten percent by weight solution of the vinyltrimethylsilane-sulfur dioxide copolymer of Example 1 in cyclopentanone was filtered through a 0.2 μm tetrafluoroethylene filter and spin-coated onto chrome/nickel slides. A resist layer about 4,000 angstroms thick was obtained.

The samples were exposed in an electron beam flood exposure apparatus at doses of 1 μC/cm$_2$ and 10 μC/cm$_2$ through a metal mask having a pattern of 3 micron wide bars separated by 6 micron wide spaces. The samples were developed with 2-methoxyethanol at developing times between 15 and 30 seconds. The samples were blown dry using air. The samples showed excellent pattern delineation with no apparent erosion.

We claim:

1. In a method of forming a positive patterned layer on a substrate comprising:
   (a) coating said substrate with a composition comprising a positive acting polymeric resist material and a suitable solvent therefor;
   (b) drying said coating to form a positive recording medium;
   (c) irradiating selected portions of said medium with radiation; and
   (d) developing the irradiated portions of said medium with a suitable developer, the improvement comprising utilizing as the resist material a copolymer having repeating units represented by the formula

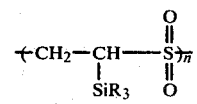

wherein R is lower alkyl and n is an integer.

2. A method in accordance with claim 1, wherein said composition contains from about 6 to about 20 percent by weight of said copolymer.

3. A method in accordance with claim 1, wherein said solvent is cyclopentanone.

4. A method in accordance with claim 1 wherein said medium is irradiated with an electron beam.

5. A method in accordance with claim 1, wherein said medium is irradiated with a modulated electron beam.

6. A method in accordance with claim 1, wherein said medium is baked prior to irradiation.

7. A method in accordance with claim 1, wherein said development exposes corresponding portions of the substrate.

8. A method in accordance with claim 7, additionally including etching the exposed substrate with a suitable etchant.

9. A method in accordance with claim 1, wherein said developer is 2-methoxyethanol.

* * * * *